(12) United States Patent
Trevino et al.

(10) Patent No.: US 9,252,238 B1
(45) Date of Patent: Feb. 2, 2016

(54) SEMICONDUCTOR STRUCTURES WITH COPLANAR RECESSED GATE LAYERS AND FABRICATION METHODS

(71) Applicant: GLOBALFOUNDRIES Inc., Grand Cayman (KY)

(72) Inventors: Kristina Trevino, Austerlitz, NY (US); Yuan-Hung Liu, Cohoes, NY (US); Gabriel Padron Wells, Saratoga Springs, NY (US); Xing Zhang, Ballston Lake, NY (US); Hoong Shing Wong, Hsinchu (TW); Chang Ho Maeng, Ballston Spa, NY (US); Taejoon Han, Clifton Park, NY (US); Gowri Kamarthy, Pleasanton, CA (US); Isabelle Orain, Alameda, CA (US); Ganesh Upadhyaya, Pleasanton, CA (US)

(73) Assignees: LAM RESEARCH CORPORATION, Fremont, CA (US); GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/461,887

(22) Filed: Aug. 18, 2014

(51) Int. Cl.
*H01L 21/336* (2006.01)
*H01L 29/66* (2006.01)
*H01L 29/51* (2006.01)
*H01L 29/49* (2006.01)
*H01L 21/3213* (2006.01)
*H01L 29/40* (2006.01)

(52) U.S. Cl.
CPC .... *H01L 29/66545* (2013.01); *H01L 21/32135* (2013.01); *H01L 29/401* (2013.01); *H01L 29/4966* (2013.01); *H01L 29/517* (2013.01)

(58) Field of Classification Search
CPC ................................................ H01L 29/66621
See application file for complete search history.

(56) References Cited

U.S. PATENT DOCUMENTS

| 8,951,855 | B2 * | 2/2015 | Lai et al. | 438/199 |
| 2003/0062568 | A1 * | 4/2003 | Beintner | 257/330 |
| 2013/0049072 | A1 * | 2/2013 | Heineck et al. | 257/202 |
| 2013/0320412 | A1 * | 12/2013 | Yamasaki | 257/288 |
| 2014/0217482 | A1 * | 8/2014 | Xie et al. | 257/288 |

* cited by examiner

*Primary Examiner* — Angel Roman
(74) *Attorney, Agent, or Firm* — Heslin Rothenberg Farley and Mesiti PC; Nicholas Mesiti

(57) ABSTRACT

Semiconductor structures and fabrication methods are provided which includes, for instance, providing a gate structure over a semiconductor substrate, the gate structure including multiple conformal gate layers and a gate material disposed within the multiple conformal gate layers; recessing a portion of the multiple conformal gate layers below an upper surface of the gate structure, where upper surfaces of recessed, multiple conformal gate layers are coplanar; and removing a portion of the gate material to facilitate an upper surface of a remaining portion of the gate material to be coplanar with an upper surface of the recessed, multiple conformal gate layers.

20 Claims, 3 Drawing Sheets

SEMICONDUCTOR STRUCTURES WITH COPLANAR RECESSED GATE LAYERS AND FABRICATION METHODS

BACKGROUND

Semiconductor structures, such as semiconductor devices or integrated circuits are typically fabricated in large batches from a semiconductor wafer. An integrated circuit fabrication typically involves a process of depositing a conductive material into appropriately configured openings in an intermediate circuit structure, for instance, to facilitate forming gate structures and/or contact structures of the transistors. This process being often referred to as gate metallization or contact metallization processing. As the integration density of transistors continues to increase, it is desirable to reduce or minimize defects within the gate structures and/or contact structures, in order to maximize fabrication efficiency and enhance commercial advantage.

BRIEF SUMMARY

The shortcomings of the prior art are overcome and additional advantages are provided through the provision, in one aspect, of a method which includes fabricating a semiconductor structure. The fabricating includes: providing a gate structure over a semiconductor substrate, the gate structure including multiple conformal gate layers and a gate material disposed within the multiple conformal gate layers; recessing a portion of the multiple conformal gate layers below an upper surface of the gate structure, where upper surfaces of recessed, multiple conformal gate layers are coplanar; and removing a portion of the gate material to facilitate an upper surface of a remaining portion of the gate material to be coplanar with the recessed, multiple conformal gate layers.

In a further aspect, a structure includes: a semiconductor structure, the semiconductor structure including a semiconductor substrate; a gate structure disposed over the semiconductor substrate, the gate structure including recessed, multiple conformal gate layers, where multiple conformal gate layers are recessed below an upper surface of the gate structure, and upper surfaces of the recessed, multiple conformal gate layers are coplanar; and a recessed gate material disposed within the recessed, multiple conformal gate layers, where an upper surface of the recessed gate material being coplanar with the upper surfaces of the recessed, multiple conformal gate layers.

In yet another aspect, a structure includes: a semiconductor structure, the semiconductor structure including, a semiconductor substrate, a gate structure disposed over the semiconductor substrate, the gate structure including recessed, multiple conformal gate layers, where multiple conformal gate layers are recessed below an upper surface of the gate structure, and upper surfaces of the recessed, multiple conformal gate layers are coplanar; and a gate material disposed within the recessed, multiple conformal gate layers, where an upper surface of the gate material being disposed above the upper surface of the gate structure.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION

Figure 1:
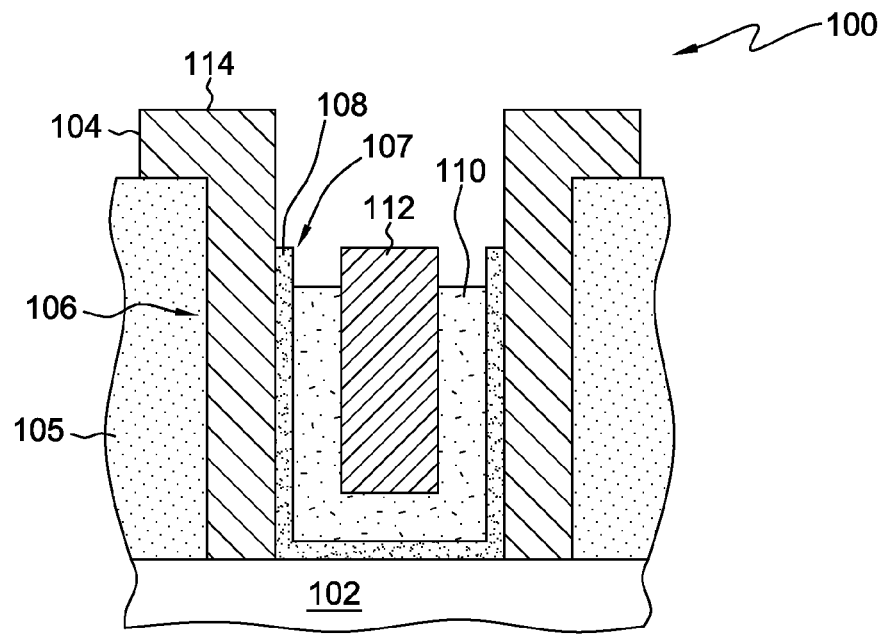
FIG. 1 depicts one embodiment of a prior-art semiconductor structure, using gate-last approach.

Aspects of the present invention and certain features, advantages, and details thereof, are explained more fully below with reference to the non-limiting embodiments illustrated in the accompanying drawings. Descriptions of well-known materials, fabrication tools, processing techniques, etc., are omitted so as to not unnecessarily obscure the invention in detail. It should be understood, however, that the detailed description and the specific examples, while indicating embodiments of the invention, are given by way of illustration only, and are not by way of limitation. Various substitutions, modifications, additions and/or arrangements within the spirit and/or scope of the underlying inventive concepts will be apparent to those skilled in the art from this disclosure.

In one aspect, during fabrication of semiconductor structures, such as semiconductor devices or integrated circuits, a gate-last, or replacement metal gate (RMG) processing may be employed to fabricate one or more gate structures. In a RMG process, a sacrificial gate structure is formed and patterned over a semiconductor substrate. For instance, the sacrificial gate structure, which may include or be fabricated of, in one example, sacrificial gate material, such as amorphous silicon (a-Si) or polysilicon, holds the position for the subsequent metal gate (RMG) electrodes to be formed. Sidewall spacers may be formed subsequently along the sidewalls of the sacrificial gate structures, followed by the formation of n and p junctions. A layer of dielectric material, such as intermetal dielectric (ILD) may subsequently be provided over the sacrificial gate structure and planarized using, for instance, chemical mechanical polishing (CMP) process, resulting in exposing an upper surface of the sacrificial gate structure. The exposed sacrificial gate structure may be removed to form a gate opening over the semiconductor substrate, within which a replacement metal gate structure may subsequently be provided.

A RMG gate structure (for instance, a layered gate structure) may be disposed within the gate opening. The layered gate structure may include, for instance, one or more gate layers disposed conformally within the gate opening and a gate material disposed within the one or more gate layers. For instance, the one or more gate layers may include a gate dielectric layer, and one or more work-function layer disposed conformally over the gate dielectric layer. Gate material, which may include or be fabricated of metal such as, tungsten, may be deposited within the one or more gate layers. As the integration density of transistors continues to increase, it is critical that the height of the gate structures be uniform across the semiconductor wafer. For instance, gate height variations, during one or more processing steps of fabrication processing, could result in height variations of the contact structures, subsequently fabricated over the replacement gate structures. These height variations of the resultant contact structures, in turn, could result in issues such as, for instance, degradation in electrical characteristics of the resultant transistors. Additionally, gate height variations, during one or more processing steps of fabrication processing, could lead to undesirable electrical noise, which could result in performance degradation of the resultant semiconductor device(s).

By way of example, FIG. 1 depicts one embodiment of a semiconductor structure 100, obtained during a semiconductor structure fabrication process.

In the example shown, semiconductor structure 100 includes a substrate 102 such as, semiconductor substrate. In one example, substrate 102 may be a bulk semiconductor material such as a bulk silicon wafer. As another example, substrate 102 may also include any silicon-containing substrate including, but not limited to, single crystal silicon (Si), silicon-on-nothing (SON), silicon-on-insulator (SOI), or silicon-on-replacement insulator (SRI) or the like.

Note that the semiconductor structure 100 depicted in FIG. 1, may be obtained during a replacement metal gate fabrication process and represents one embodiment of a structure obtained after the sacrificial gate material and thin oxide layer underlying the sacrificial gate material have been removed. One skilled in the art will note that a thin oxide layer (also referred to as pad oxide) (not shown) is typically disposed over substrate 102, to protect the substrate during subsequent processing. A sacrificial gate material (also not shown), such as, for example, amorphous-silicon, may also be provided over the thin oxide layer, to hold the gate position for subsequent metal gate electrodes to be formed. A portion of the thin oxide layer and sacrificial gate material may be patterned using conventional etching processes, to define a sacrificial gate structure (not shown). The etching processes may include conventional anisotropic dry etching processing, for example, reactive ion etching or isotropic wet etching processes.

Sidewall spacers 104 are provided (in one embodiment) along the sacrificial gate structure (not shown). These sidewall spacers 104 are thin film layers (or spacers) formed along the sidewalls of the sacrificial gate structure. Sidewall spacers 104 may be deposited using conventional deposition processes such as, chemical vapor deposition (CVD), low-pressure CVD or plasma-enhanced CVD (PE-CVD). In one example, sidewall spacers 104, may have conventional thickness and include or be fabricated of a material such as, silicon nitride.

A layer of dielectric material 105 may be disposed over substrate 102, for instance, along sidewall spacers 104. In one example, dielectric material layer 105 may include or be fabricated of a flowable oxide material, of relatively low quality within the spectrum of available oxides, and may be deposited using any conventional deposition process(es) such as, a chemical vapor deposition (CVD) process. In another example, dielectric material layer 105 may include, but not be limited to, silicon oxide ($SiO_2$) and fluorinated silicate glass (FSG).

The sacrificial gate structures (not shown), including the sacrificial gate material and thin oxide layer, are subsequently removed using one or more etching processes to form one or more gate openings (not shown) within dielectric material layer 105. Any suitable etching process such as, anisotropic dry etching processing, for example, reactive ion etching may be employed to selectively remove the sacrificial gate structures to define gate openings.

One or more gate structures 106 may be provided within dielectric material layer 105 (for instance, within sidewall spacers 104) at selected locations to operate as, for instance, the gates of transistors being fabricated within semiconductor structure 100. Gate structure 106 may include one or more gate layers 107 disposed within one or more gate openings patterned within dielectric material layer 105. The one or more gate layers 107 may include, for instance, a gate dielectric layer 108, and one or more work-function layers 110 disposed over gate dielectric layer 108. Note that the one or more of these gate layers may be formed using a variety of different materials and techniques such as, for instance, atomic layer deposition (ALD), chemical vapor deposition (CVD), physical vapor deposition (PVD) and the plasma-enhanced versions of the same processes. The thickness of the layers may also vary, depending upon the particular application.

Gate fabrication further includes providing a gate material 112 over the one or more gate layers 107, which in one embodiment, may be a replacement gate material as part of gate-last fabrication process. In one example, the replacement gate material may include or be fabricated of a metal, for instance, tungsten.

Continuing with FIG. 1, one or more lithographic etching processes may be performed to recess a portion of one or more gate layers 107 along with a portion of gate material 112 disposed therein, below an upper surface 114 of gate structure 106. The recessing of gate layers 107 and gate material 112 facilitates isolating of a hard mask layer (not shown) which may be disposed during subsequent deposition processes. Although not depicted, one skilled in the art will know that these lithographic etching processes may include (for instance) recessing a portion of gate material 112 below upper surface 114 of gate structure 106, recessing a portion of work-function layer 110, and subsequently recessing a portion of gate dielectric layer 108. Note that these lithographic etching processes may be performed employing, for instance, isotropic wet etching processes or anisotropic dry etching processes using one or more etch chemistries. As a part of two-step etch process, gate material 112 may be recessed from within gate structure 106, resulting in exposing underlying gate layers (for instance, work-function layer 110 and gate dielectric layer 108). Note that the etching process is typically prolonged to also recess underlying work-function layer and gate dielectric layer from within gate structure 106. This non-selective over-etching process performed (in part) to etch away gate material 112, work-function layer 110 and gate dielectric layer 108 disadvantageously can result in over-etching the work-function layer as compared to gate dielectric layer 108 and gate material 112, and thereby result in height variations within the recessed gate structure. As noted above, these height variations could lead to undesirable electrical noise, which could result in performance degradation of the resultant semiconductor device(s).

To address these issues, disclosed herein, in one aspect, is a method of fabricating a semiconductor structure with recessed gate layers (for instance, a gate dielectric layer and work-function layers) along with recessed gate material, having coplanar upper surfaces. The fabricating method includes, for instance: providing a gate structure over a semiconductor substrate, the gate structure including multiple conformal gate layers and a gate material disposed within the multiple conformal gate layers; recessing a portion of the multiple conformal gate layers below an upper surface of the gate structure, where upper surfaces of the recessed, multiple conformal gate layers are coplanar; and removing a portion of the gate material to facilitate an upper surface of a remaining portion of the gate material to be coplanar with an upper surface of the recessed, multiple conformal gate layers.

In one embodiment, providing includes providing at least one conformal gate layer of the multiple conformal gate layers, and the recessing includes recessing a portion of the at least one conformal gate layer of the multiple conformal gate layers, prior to removing the gate material disposed within the gate structure. In another embodiment, the multiple conformal gate layers includes a gate dielectric layer disposed conformally within the gate structure, and a work-function layer disposed conformally above the gate dielectric layer, and the recessing includes recessing a portion of the work-function layer from within the gate structure, prior to recessing the gate dielectric layer. Note that the recessed, multiple conformal gate layer, for instance, could be one of a recessed work-function layer or a recessed gate dielectric layer.

In one aspect, the recessing includes performing a first recessing process over the work-function layer, and subsequently performing a second recessing process over the gate dielectric layer. By way of example, the first recessing process over the work-function layer may be performed at a first time interval, and the second recessing over the gate dielectric layer may be performed at a second time interval, the second time interval being longer that the first time interval. The recessing may further include performing the first recessing process of the work-function layer, and performing the second recessing of the gate dielectric layer using same etching chemistries, for instance, employing boron trichloride gas. In one example, the gate dielectric layer may include or be fabricated of a high-k dielectric material, such as hafnium oxide ($HfO_2$), and the work-function layer may include or be fabricated of a metal such as, titanium, tantalum, aluminum or combinations thereof.

In another aspect, the method includes recessing of the multiple conformal gate layers (for instance, work-function layer and gate dielectric layer) being performed using a first etching chemistry, for instance, employing boron trichloride gas, and removing of the gate dielectric layer being performed using a second etching chemistry, for instance, employing silicon tetrachloride. Note that in one example, the gate material includes a metal such as, tungsten.

By way of example, FIGS. 2A-2D depict one detailed embodiment of a method of fabricating a semiconductor structure with recessed gate layers (for instance, a gate dielectric layer and work-function layers) along with recessed gate material, having coplanar upper surfaces, in accordance with one or more aspects of the present invention.

Figure 2A:
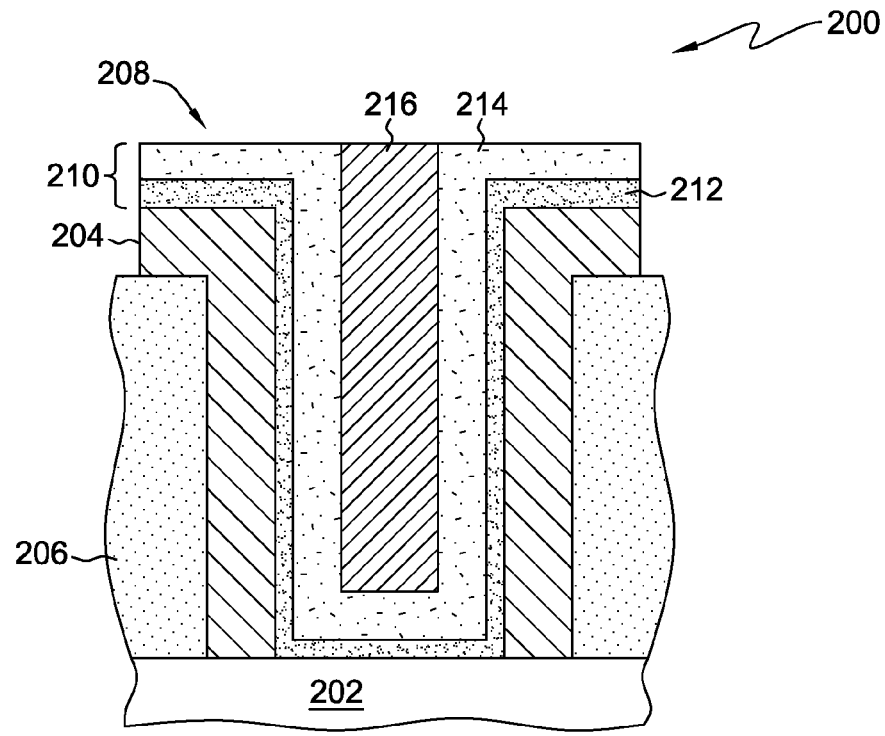
FIG. 2A is a partial cross-sectional elevational view of one embodiment of a semiconductor structure obtained during semiconductor structure fabrication, in accordance with one or more aspects of the present invention.

FIG. 2A illustrates one embodiment of a semiconductor structure 200 useful in a semiconductor structure fabrication process, in accordance with one or more aspects of the present invention. In the example shown, semiconductor structure 200 includes a substrate 202, such as a semiconductor substrate. In one example, substrate 202 may be a bulk semiconductor material such as a bulk silicon wafer. As another example, substrate 202 may include or be a silicon-containing substrate including, but not limited to, silicon (Si), single crystal Si, polycrystalline Si, amorphous Si, silicon-on-nothing (SON), silicon-on-insulator (SOI), or silicon-on-replacement insulator (SRI) substrate or the like. Substrate 202 may in addition or instead include various isolations, dopings and/or device features. For instance, substrate 202 may include other suitable elementary semiconductors, such as, for example, germanium (Ge) in crystal, or a compound semiconductor such as silicon carbide (SiC), gallium arsenide (GaAs), gallium phosphide (GaP), indium phosphide (InP), indium arsenide (InAs), and/or indium antimonide (InSb).

As noted above, semiconductor structure 200 depicted in FIG. 2A, may be obtained during a replacement metal gate fabrication process and represents one embodiment of a structure obtained after the sacrificial gate material and thin oxide layer underlying the sacrificial gate material have been removed. One skilled in the art will note that a thin oxide layer (also referred to as pad oxide) (not shown) is typically disposed over substrate 202, to protect the substrate during subsequent processing. A sacrificial gate material (also not shown), such as, for example, amorphous-silicon, may also be provided over the thin oxide layer, to hold the gate position for subsequent metal gate electrodes to be formed. A portion of the thin oxide layer and sacrificial gate material may be patterned using conventional etching processes, to define a sacrificial gate structure (not shown). The etching processes may include conventional anisotropic dry etching processing, for example, reactive ion etching or isotropic wet etching processes.

Sidewall spacers 204 are provided (in one embodiment) along the sacrificial gate structure (not shown). These sidewall spacers 204 are thin film layers (or spacers) formed along the sidewalls of the sacrificial gate structure. Sidewall spacers 204 may be deposited using conventional deposition processes such as, chemical vapor deposition (CVD), low-pressure CVD or plasma-enhanced CVD (PE-CVD). In one example, sidewall spacers 204, may have conventional thickness and include or be fabricated of a material such as, silicon nitride.

A layer of dielectric material 206 may be disposed over substrate 202, for instance, along sidewall spacers 204. In one example, dielectric material layer 206 may include or be fabricated of a flowable oxide material, of relatively low quality within the spectrum of available oxides, and may be deposited using any conventional deposition process(es) such as, a chemical vapor deposition (CVD) process. In another example, dielectric material layer 206 may include, but not be limited to, silicon oxide ($SiO_2$) and fluorinated silicate glass (FSG).

The sacrificial gate structures (not shown), including the sacrificial gate material and thin oxide layer, are subsequently removed using one or more etching processes to form one or more gate openings (not shown) within dielectric material layer 206. Any suitable etching process such as, anisotropic dry etching processing, for example, reactive ion etching may be employed to selectively remove the sacrificial gate structures to define gate openings.

One or more gate structures 208 may be provided within dielectric material layer 206 (for instance, within sidewall spacers 204) at selected locations to operate as, for instance, the gates of transistors being fabricated within semiconductor structure 200. Gate structure 208 may include one or more gate layers 210 disposed conformally within one or more gate openings patterned within dielectric material layer 206. The one or more conformal gate layers 210 may include, for instance, a gate dielectric layer 212 disposed within and extending over sidewall spacers 204, and one or more work-function layers 214 disposed over gate dielectric layer 212. Note that the one or more of these gate layers may be formed using a variety of different materials and techniques such as, for instance, atomic layer deposition (ALD), chemical vapor deposition (CVD), physical vapor deposition (PVD) and the plasma-enhanced versions of the same processes. The thickness of the layers may also vary, depending upon the particular application. Although the following numbers are relative and the height of conformal gate layers 210 could vary, as one specific example, gate dielectric layer 212 and work-function layers 214 may have a height in a range of about 70 nm to 130 nm.

By way of example, gate dielectric layer 212 may include an oxide material, such as a high-k dielectric material with a dielectric constant k greater than about, for instance, 3.9 (note that k=3.9 for $SiO_2$), and may be deposited by performing suitable deposition process, such as atomic layer deposition (ALD), physical vapor deposition (PVD), chemical vapor deposition (CVD), or the like. Example of high-k dielectric materials which may be used as gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide and lead zinc niobate. As noted, one or more work-function layers 214 may be conformally deposited over gate dielectric layer 212, for example, via a deposition process such as ALD, CVD or PVD. The work-function layer(s) 214 may include or be fabricated of, for instance, titanium nitride (TiN), tantalum nitride (TaN), titanium aluminum nitride (TiAlN), tantalum aluminum nitride (TaAlN), niobium nitride (NbN), vanadium nitride (VN), tungsten nitride (WN) or the like.

Gate fabrication process further includes providing a gate material 216 over the one or more gate layers 210, which in one embodiment, may be a replacement gate material as part of gate-last fabrication process. In one example, the replacement gate material may include or be fabricated of a metal, for instance, tungsten, aluminum, or copper. A non-selective chemical-mechanical polish may be employed to polish away excess gate material 216, with the chemical-mechanical polishing terminating at an upper surface of work-function layer 214, resulting in the upper surface of gate material 216 being substantially coplanar with the upper surface of the work-function layer 214. In one example, gate material 216 disposed within the gate structure may have a height in a range of about 60 nm to 130 nm.

Figure 2B:
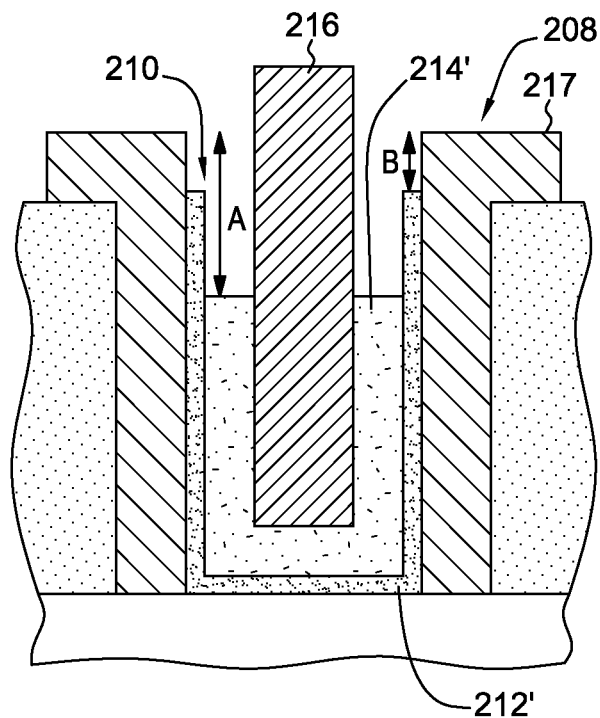
FIG. 2B depicts the semiconductor structure of FIG. 2A after recessing a work-function layer and at least partially recessing a gate dielectric layer, in accordance with one or more aspects of the present invention.

As illustrated in FIG. 2B, one or more lithographic etching processes may be performed to selectively recess a portion of gate layers 210, for instance, a work-function layer 214 (see FIG. 2A) from within gate structure 208. In one embodiment of the present invention, work-function layer 214 (see FIG. 2A) may be recessed using any suitable removal process, such as an etching process with an etchant selective to, for instance, materials of work-function layer 214 (see FIG. 2A) and gate dielectric layer 212 (see FIG. 2A), but not to gate material 216, so that the etching stops at a desired depth below an upper surface of gate structure 208, as depicted. Note that this etching process facilitates in removing a portion of the work-function layer from an upper surface 217 of gate structure 208, as well as from within the gate structure to create a recessed work-function layer 214', resulting in exposing the underlying gate dielectric layer 212 (see FIG. 2A). By way of example, etching may be an anisotropic etching, such as reactive ion etching (RIE), using an appropriate chemistry (for instance, using a first etching chemistry), depending on the material of the layers being etched. In one example, anisotropic dry etching may be performed using chlorine-based chemistry and gases such as, boron trichloride ($BCl_3$) and oxygen ($O_2$) in the presence of inert gases such as, helium (He), at an etch rate of about 40 nm/min to 80 nm/min for a first time interval of about 30 sec to 100 sec. In a specific example, the work-function layer may be recessed using boron trichloride ($BCl_3$) and oxygen ($O_2$) in the presence of inert gases such as, helium at an etch rate of about 60 nm/min for a time period of about 40 sec. By way of example, the recessed depth (A) of work-function layer 214' from an upper surface of gate structure, for instance, may be about 20-40 nm in the case of short channel and the long channel length. Note that, in one embodiment, the height of recessed work-function layer 214' remaining within gate structure 208 may be in the range of 40 to 100 nm in both the short and long channel. This etching process also facilitates in partially recessing a portion of the exposed gate dielectric layer 212 from an upper surface of gate structure 208, creating a partially recessed gate dielectric layer 212' within gate structure 208. In one example, the recessed depth (B) of the gate dielectric layer 212' from an upper surface of gate structure 206 may be about 7 nm to 15 nm.

Figure 2C:
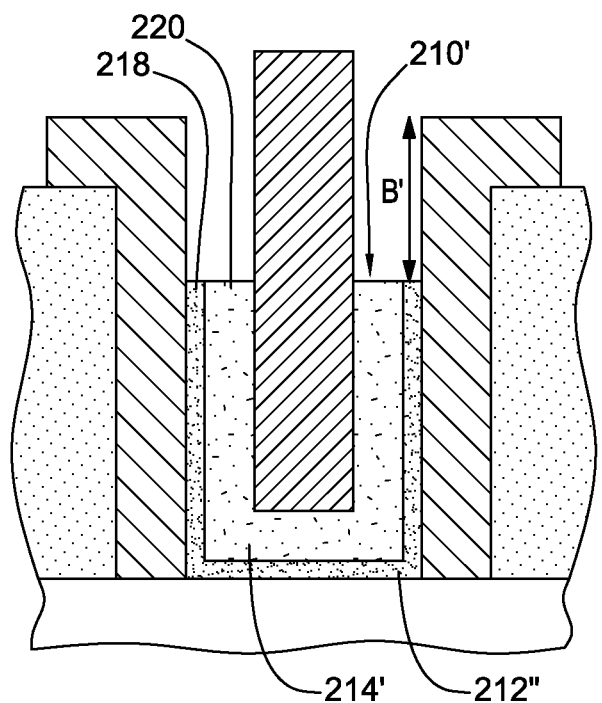
FIG. 2C depicts the semiconductor structure of FIG. 2B after recessing a gate dielectric layer to be coplanar with a recessed work-function layer, in accordance with one or more aspects of the present invention.

In one embodiment, to reduce the height variations of gate layers 210, and thus provide a more coplanar upper surface, one or more lithographic etching processes employed to recess the work-function layers discussed above (for instance, in connection with FIG. 2B), may be prolonged to further recess the partially recessed gate dielectric layer 212' (see FIG. 2B) from within gate structure 208, resulting in a recessed gate dielectric layer 212" within gate structure 208. The result is that the upper surfaces 218 of recessed gate dielectric layer 212" and upper surfaces 220 of recessed work-function layer 214' are substantially coplanar, as depicted in FIG. 2C. For instance, partially recessed gate dielectric layer 212' (see FIG. 2C) may be further recessed employing anisotropic dry etching process using chlorine-based chemistry and gases such as, boron trichloride ($BCl_3$) and oxygen ($O_2$) in the presence of inert gases such as, helium (He), at an etch rate of about 10 nm/min to 20 nm/min, for a second time interval of about 40 sec to 120 sec. In a specific example, the partially recessed gate dielectric layer 212" may be further recessed using boron trichloride ($BCl_3$) and oxygen ($O_2$) in the presence of inert gases such as, helium at an etch rate of about 15 nm/min for a time period of about 60 sec. Note that, the second time interval employed to performing recessing of the gate dielectric layer 212 (see FIG. 2A) may be substantially longer than the first time interval employed to performing recessing of the work-function layer 214 and may be, for instance, in the range of about of about 20 to 100 sec. Additionally, note that, the etch rate employed to perform recessing of gate dielectric layer 212 (see FIG. 2A) may be substantially slower than the etch rate employed to perform recessing of work-function layer 214. By way of example, the recessed depth (B) of gate dielectric layer 212" from an upper surface of gate structure 208, for instance, may substantially be similar to the recessed depth (A) of work-function layer 214' and may be, for example, about 20-40 nm in the case of short channel and the long channel length.

Figure 2D:
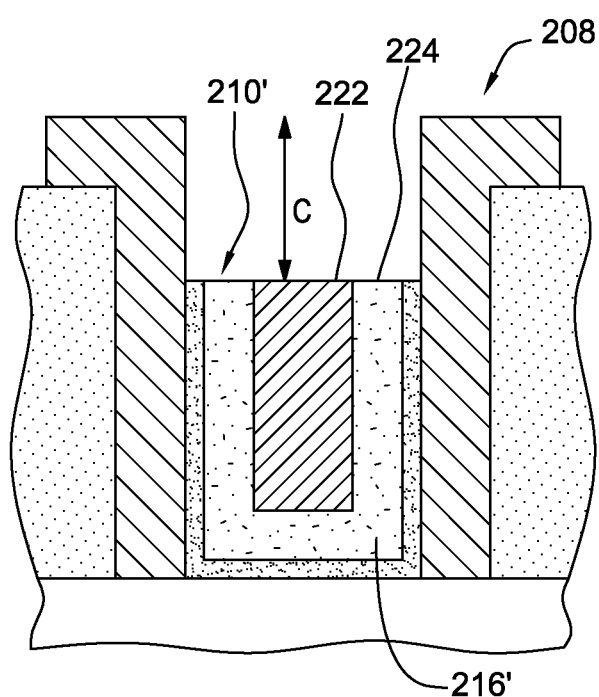
FIG. 2D depicts the semiconductor structure of FIG. 2C after recessing a gate material to be coplanar with a recessed work-function layer and a recessed gate dielectric layer, in accordance with one or more aspects of the present invention.

As depicted in FIG. 2D, one or more lithographic etching processes may be performed to selectively remove a portion of gate material 216 (see FIG. 2C), using (in one embodiment) recessed gate layers 210' as an etch stop, resulting in a recessed gate material 216' within gate structure 208, in accordance with one or more aspects of the present invention. Note that, advantageously, there is no variation in height, as shown in FIG. 2D, between an upper surface 222 of recessed gate material 216' and upper surfaces 224 of recessed gate layers 210', since the upper surfaces of the previously recessed gate layers are coplanar. Removal may be accomplished using any suitable removal process, such as an etching process with an etchant selective to, for instance, the gate material 216 (see FIG. 2C), but not recessed gate layers 210', so that the etching stops at an upper surface of the recessed gate layers. By way of example, etching may be an anisotropic etching, such as reactive ion etching (RIE), using an appropriate chemistry (for instance, using a second etching chemistry), depending on the gate material being etched. In one example, anisotropic dry etching may be performed using chlorine-based chemistry and gases such as, silicon tetrachloride ($SiCl_4$), chlorine ($Cl_2$) and nitrogen trifluoride ($NF_3$) in the presence of inert gases such as, oxygen ($O_2$), nitrogen ($N_2$) and helium (He), at an etch rate of about 50 nm/min to 70 nm/min for a time period of about 10 sec to 30 sec. In a specific example, the gate material may be recessed using silicon tetrachloride ($SiCl_4$), chlorine ($Cl_2$) and nitrogen trifluoride ($NF_3$) in the presence of inert gases such as, oxygen ($O_2$), nitrogen ($N_2$) and helium (He), at an etch rate of about 50 nm/min for a time period of about 12 sec. Note that, in one embodiment, the second etching chemistry employed to perform recessing of the gate layers may be substantially different from the first etching chemistry employed to perform the removal of a portion of the gate layer. Note that, in one embodiment, the etching processes may be employed utilizing controlled process parameters to uniformly etch the gate material from all directions, thereby controlling depth (C) of recessed gate material 216'. By way of example, the recessed depth (C) of gate material 216' from an upper surface of gate structure 208, for instance, may be in the range of about 15-40 nm in the case of short channel length and may be in the range of about 0-20 nm in the case of long channel length.

Advantageously, the methods and resultant semiconductor structures disclosed herein advantageously facilitate fabrication of a semiconductor structure with recessed gate layers (for instance, gate dielectric layer and one or more work-function layers) along with recessed gate material, having coplanar upper surfaces, within an upper surface of one or more gate structures. This coplanarity of recessed gate layers and recessed gate material advantageously facilitates in controlling "loading effects" between short channel and long channels devices and, in turn, improves over-all gate resistance of the resultant transistors. This uniformity or coplanarity of resultant gate structures further prevents electrical shorting of the gate structures and the contact structures during subsequent source and drain contact etching processes. Additionally, the present invention disclosed herein results in improving the process marginality of the over-all gate-last fabrication process.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. A method comprising:
   fabricating a semiconductor structure, the fabricating comprising:
   providing a gate structure over a semiconductor substrate, the gate structure comprising multiple conformal gate layers and a gate material disposed within the multiple conformal gate layers;
   recessing a portion of the multiple conformal gate layers below an upper surface of the gate structure, wherein upper surfaces of the recessed, multiple conformal gate layers are coplanar; and
   removing a portion of the gate material to facilitate an upper surface of a remaining portion of the gate material to be coplanar with an upper surface of the recessed, multiple conformal gate layers.

2. The method of claim 1, wherein the providing comprises providing at least one conformal gate layer of the multiple conformal gate layers, and the recessing comprises recessing a portion of the at least one conformal gate layer of the multiple conformal gate layers, prior to removing the gate material disposed within the gate structure.

3. The method of claim 1, wherein the multiple conformal gate layers comprise a gate dielectric layer disposed conformally within the gate structure, and a work-function layer disposed conformally above the gate dielectric layer, and the recessing comprises recessing a portion of the work-function layer from within the gate structure, prior to recessing the gate dielectric layer.

4. The method of claim 3, wherein the recessed, multiple conformal gate layer comprises one of a recessed work-function layer or a recessed gate dielectric layer.

5. The method of claim 3, wherein the recessing comprises performing a first recessing process, and performing a second recessing process, the first recessing process being performed over the work-function layer, and the second recessing process being performed over the gate dielectric layer.

6. The method of claim 5, wherein the first recessing process being performed at a first time interval, and the method further comprises performing the second recessing process at a second time interval, the first time interval and the second time interval being different time intervals, and the second time interval being longer than the first time interval.

7. The method of claim 5, wherein the recessing further comprises performing the first recessing process of the work-function layer, and performing the second recessing process of the gate dielectric layer using same etching chemistries.

8. The method of claim 7, wherein the same etching chemistries are performed employing boron trichloride gas.

9. The method of claim 3, wherein the gate dielectric layer comprises a high-k gate dielectric layer, and wherein the work-function layer comprises a metal work-function layer.

10. The method of claim 1, wherein the method comprises recessing of the multiple conformal gate layers being performed using a first etching chemistry, and removing of the gate material being performed using a second etching chemistry, the first etching chemistry and the second etching chemistry employing different etching chemistries.

11. The method of claim 10, wherein the first etching chemistry being performed employing boron trichloride, and the second etching chemistry being performed employing silicon tetrachloride.

12. The method of claim 1, wherein the gate material comprises a metal gate material.

13. A structure comprising:
a semiconductor structure, the semiconductor structure comprising:
a semiconductor substrate;
a gate structure disposed over the semiconductor substrate, the gate structure comprising recessed, multiple conformal gate layers, wherein multiple conformal gate layers are recessed below an upper surface of the gate structure, and upper surfaces of the recessed, multiple conformal gate layers are coplanar; and
a recessed gate material disposed within the recessed, conformal gate layers, wherein an upper surface of the recessed gate material is coplanar with the upper surfaces of the recessed, multiple conformal gate layers.

14. The structure of claim 13, wherein the recessed, multiple conformal gate layers comprise a recessed gate dielectric layer, and wherein the structure further comprises a recessed work-function layer disposed over the recessed gate dielectric layer, an upper surface of the gate dielectric layer being coplanar with an upper surface of the recessed work-function layer.

15. The structure of claim 14, wherein the recessed gate dielectric layer comprises a high-k gate dielectric layer, and wherein the recessed work-function layer comprises a metal work-function layer.

16. The structure of claim 13, wherein the recessed gate material comprises a metal gate material.

17. A structure comprising:
a semiconductor structure, the semiconductor structure comprising:
a semiconductor substrate;
a gate structure disposed over the semiconductor substrate, the gate structure comprising recessed, multiple conformal gate layers, wherein multiple conformal gate layers are recessed below an upper surface of the gate structure, and upper surfaces of the recessed, multiple conformal gate layers are coplanar; and
a gate material disposed within the recessed, multiple conformal gate layers, wherein an uppermost surface of the gate material is disposed above the upper surface of the gate structure.

18. The structure of claim 17, wherein the recessed, multiple conformal gate layers comprise a recessed gate dielectric layer, and wherein the structure further comprises a recessed work-function layer disposed over the recessed gate dielectric layer, an upper surface of the gate dielectric layer being coplanar with an upper surface of the recessed work-function layer.

19. The structure of claim 17, wherein the recessed gate dielectric layer comprises a high-k gate dielectric layer, and wherein the recessed work-function layer comprises a metal work-function layer.

20. The structure of claim 17, wherein the gate material comprises a metal gate material, and the structure further comprises the upper surface of the gate material being disposed above the upper surface of the recessed, at least one conformal gate layer.

* * * * *